United States Patent [19]
Dennis et al.

[11] 3,982,159
[45] Sept. 21, 1976

[54] LEADLESS PACKAGE RETAINING FRAME

[75] Inventors: Richard Kay Dennis, Etters; Edward Leal Hadden, Mechanicsburg, both of Pa.

[73] Assignee: E. I. Du Pont de Nemours and Company, Wilmington, Del.

[22] Filed: Nov. 11, 1974

[21] Appl. No.: 522,925

[52] U.S. Cl. .................. 317/101 CC; 339/17 CF
[51] Int. Cl.² ........................................ H05K 1/04
[58] Field of Search ............... 317/101 CC, 101 CP, 317/101 DH; 339/95 R, 95 M, 17 CF

[56] References Cited
UNITED STATES PATENTS

| | | | |
|---|---|---|---|
| 3,551,750 | 12/1970 | Sterling | 317/101 DH |
| 3,831,131 | 8/1974 | Woodcock et al. | 339/17 CF |
| 3,873,173 | 3/1975 | Anhalt | 339/17 CF |
| 3,877,064 | 4/1975 | Scheingold | 317/101 CC |

*Primary Examiner*—David Smith, Jr.

[57] ABSTRACT

A retaining frame for forming interconnections between contact pads on a flat leadless I.C. package and corresponding pads on a parallel mother board so that when the package is moved toward the mother board and into the frame, contacts in the frame are compressed and contact surfaces are biased toward and moved along the contact pads on the package and board to form positive wiped electrical connections.

11 Claims, 9 Drawing Figures

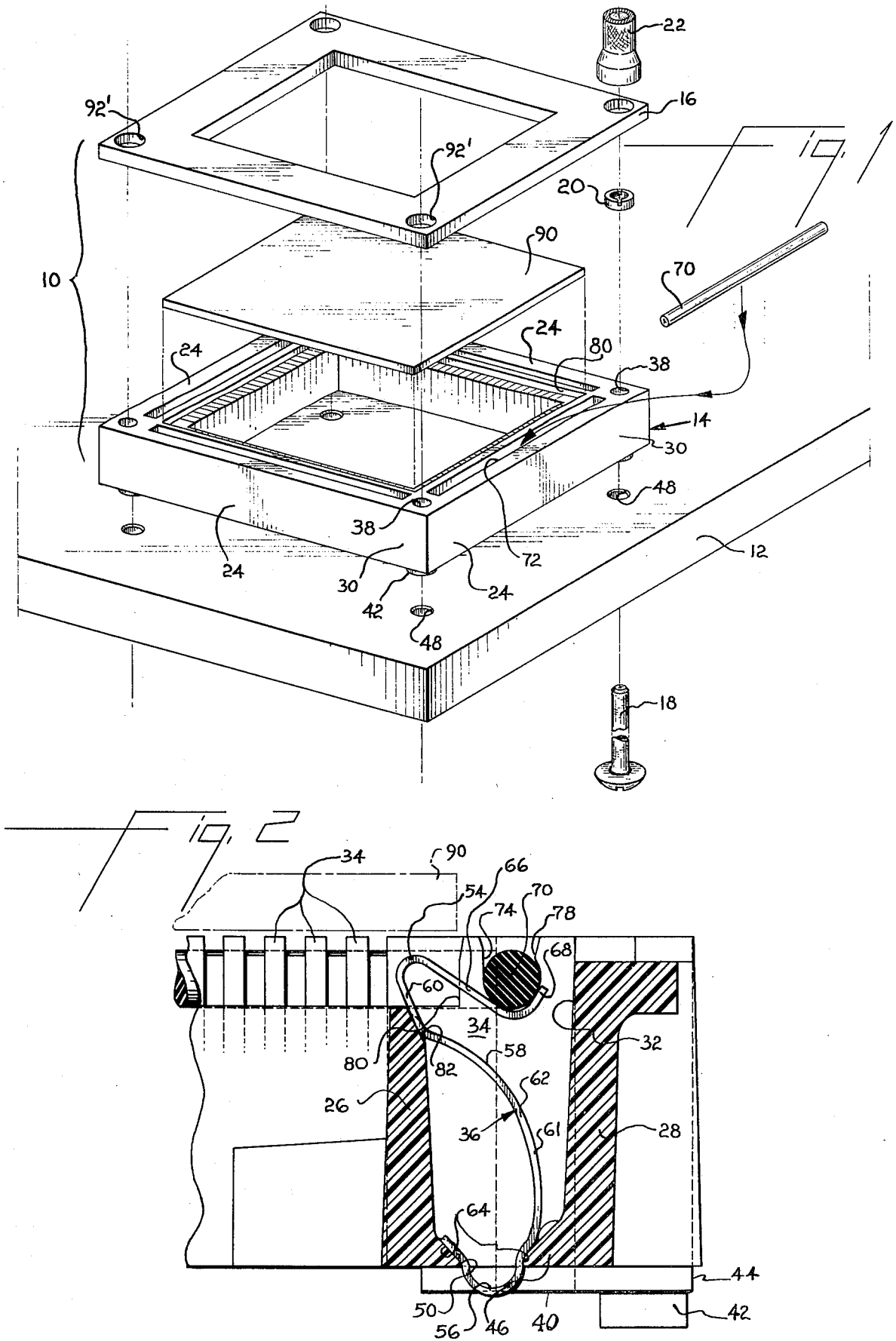

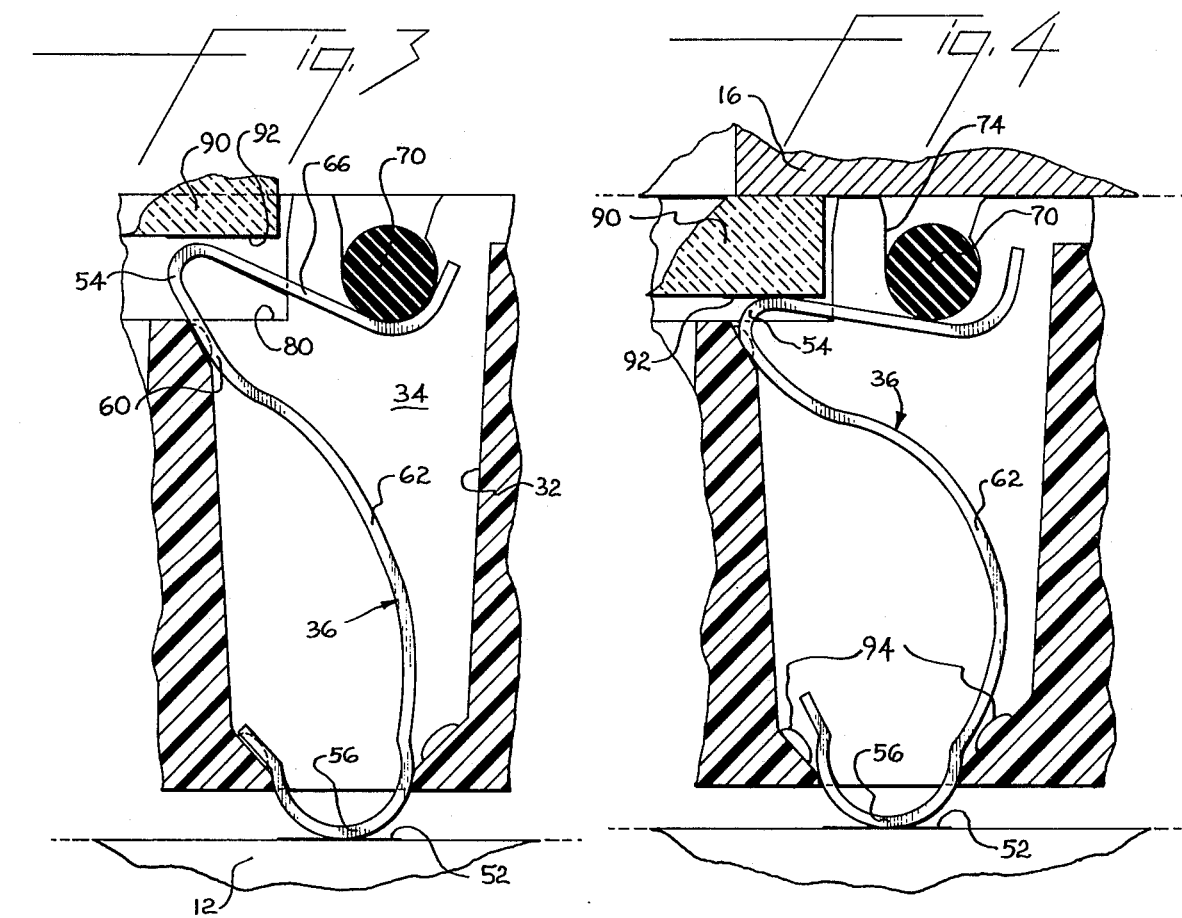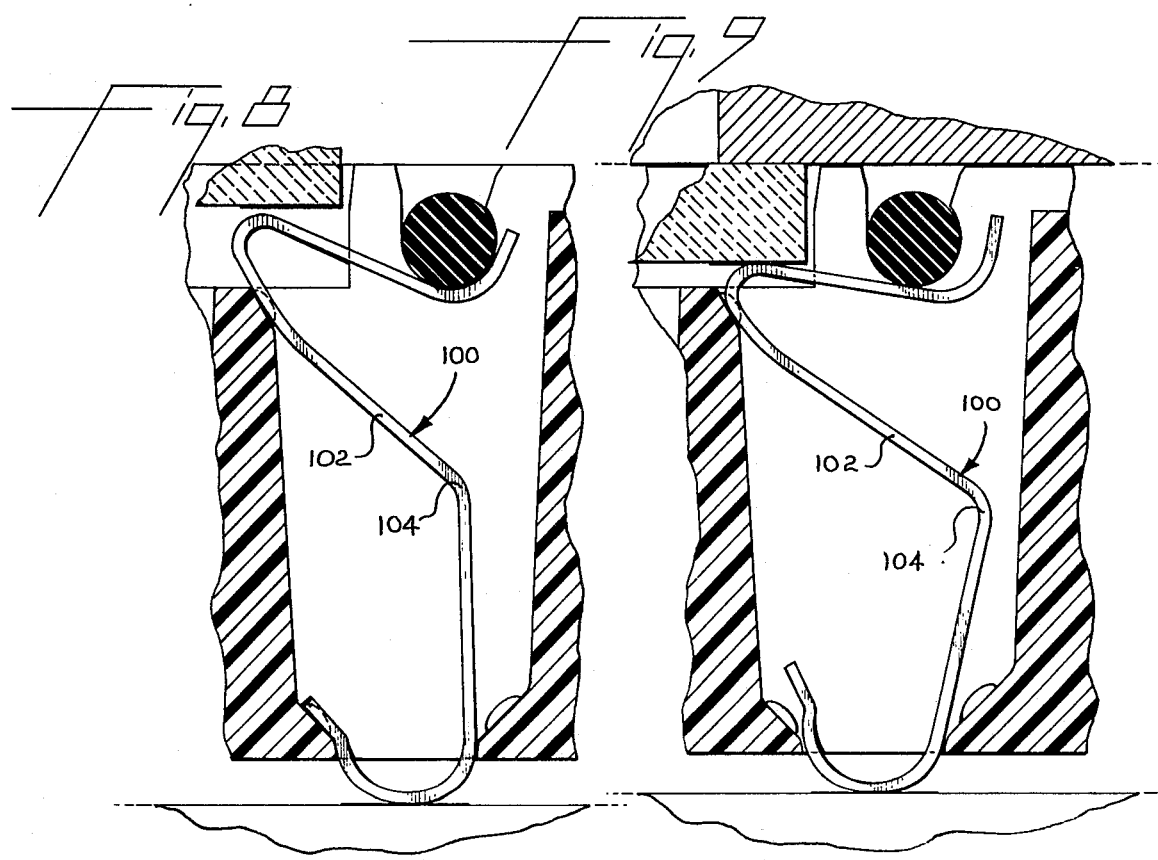

LEADLESS PACKAGE RETAINING FRAME

The invention relates to a leadless package retaining frame on which a flat leadless package is mounted parallel to a mother board with individual contacts in the frame forming electrical connections between pads on the package and on the mother board. The frame is mounted on the mother board prior to mounting of the package on the frame. When mounted on the mother board, the contacts held by the frame are in alignment with the pads on the mother board, however, the final wiped electrical connections between the contacts and mother board pads are not formed at this time.

When the leadless package is mounted on the frame, the contacts carried thereby are deformed so that wiped high pressure electrical connections are formed between each contact and its respective mother board pad and leadless package pad. In this way, impurities on both the mother board and leadless package pads are wiped away at the time of assembly of the package to the frame. This feature facilitates mounting of the frame on the mother board long prior to the time when the substrate is mounted on the frame.

U.S. Pat. Nos. 3,700,788; 3,754,203; 3,771,109; and 3,831,131 disclose various types of connector blocks or frames used for mounting flat circuit packages parallel to a mother board. In all of these patents, the mounting of the package in the frame does not effect the electrical connection between the contacts and the mother board.

Interconnecting spring contacts joining pads on adjacent boards or supports are taught by U.S. Pat. Nos. 3,529,213; 3,551,750; 3,678,343; and 3,129,990. None of these patents disclose interconnecting spring contacts where movement of one of the pad carrying supports stresses the contacts in such a way that wiped pressure electrical connections are formed between the contact and both pad carrying supports.

Other objects and features of the invention will become apparent as the description proceeds, especially when taken in conjunction with the accompanying drawings illustrating the invention, of which there are three sheets.

In the drawings:

FIG. 1 is a perspective view illustrating the components of the leadless package assembly including a retaining frame;

FIG. 2 is a sectional view taken through one side member of the frame;

FIGS. 3 and 4 are views similar to that of FIG. 2 illustrating the frame attached to the circuit board prior to and following loading of the leadless package;

FIGS. 8 and 9 are views similar to FIGS. 3 and 4 but illustrating a different contact.

Figure 5:
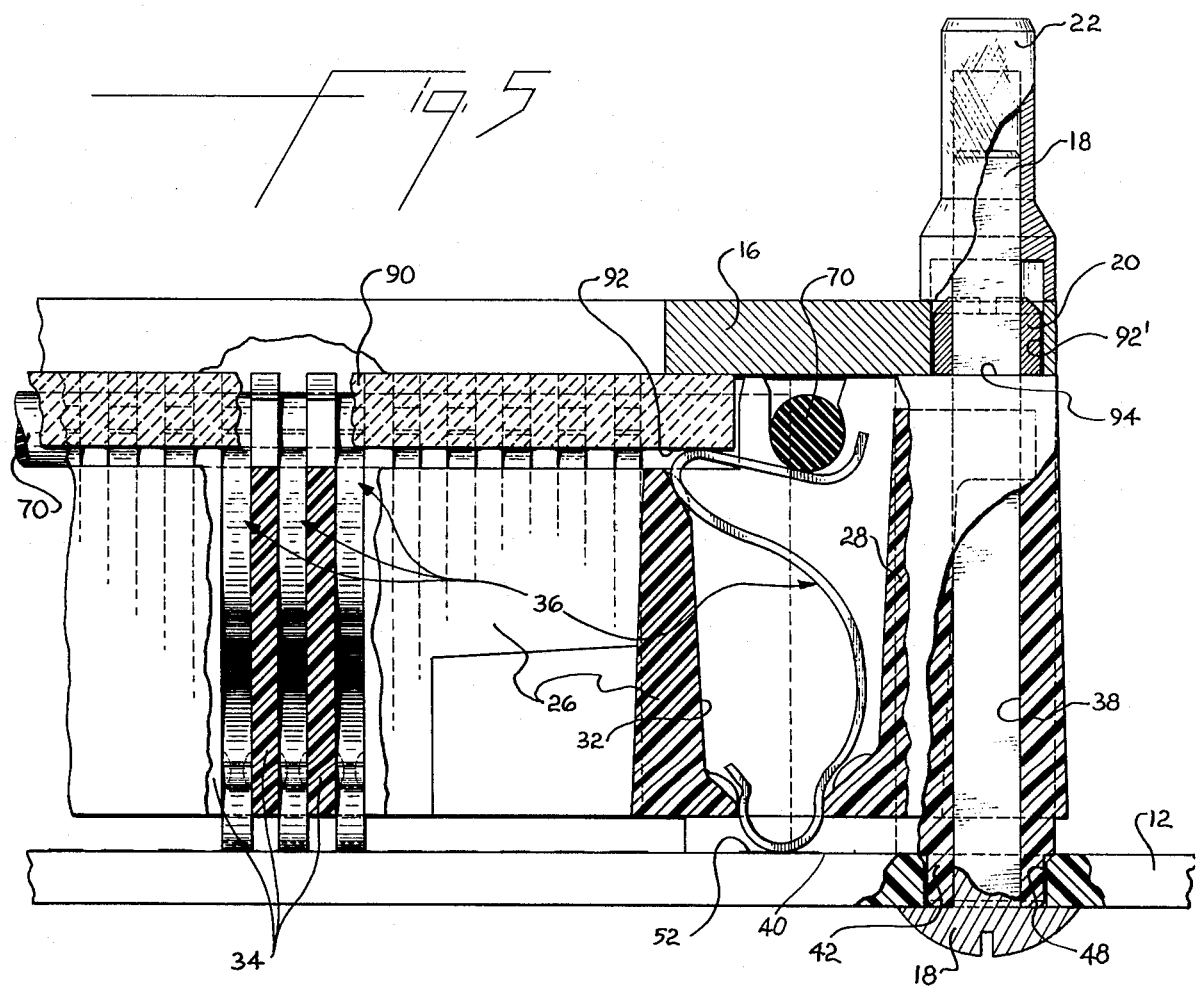
FIG. 5 is a sectional view similar to FIG. 4 showing additional parts of the frame.

The leadless package assembly 10 is adapted to be mounted on a circuit or mother board 12 and includes a square frame 14 formed of di-electric material and a hold-down plate 16. The frame and plate are secured to the circuit board by means of four bolts 18 and four nuts 20 and 22. The frame 14 includes four side members 24, each having an inner wall 26 and an outer wall 28, the inner and outer walls extending between adjacent corners 30 of the frame 14. The space between the inner and outer wall 26 and 28 is divided into a number of contact cavities 32 by partitions 34 extending between the walls 26 and 28. A specialized electrical contact 36 is confined in each cavity 32.

Bores 38 located at corners 30 extend through the thickness of frame 14 and beyond the lower surface 40 thereof to define alignment collars 42 extending downwardly below the lower surface 40 of the frame at corner pads 44. The lower surfaces 46 of the side members 24 joining the corners are spaced above surfaces 40 so that when the frame is mounted on the circuit board 12, surfaces 40 rest flush on the board and surfaces 46 are spaced above the board.

The circuit board 12 is provided with four mounting holes 48 which extend through the thickness of the board and are slightly larger in diameter than the outer diameter of collars 42. The frame is positioned on the board with collars 42 extending into holes 48, as shown in FIG. 5, and with surfaces 40 resting flush on the board. With the frame in this position, the lower opening 50 of each contact cavity 32 is positioned directly above a metalized contact pad 52 on the surface of the circuit board. The contact pads 52, not shown in FIG. 1, are connected to printed circuit paths on the surface of circuit board 12.

As shown in the figures, each contact 36 comprises a strip of resilient conductive metal having a first contact nose 54, a second contact nose 56 facing away from nose 54, a portion 58 joining said noses including a flat cam-engaging portion 60 extending from nose 54 and a uniformly bowed flexing portion 62. Each nose 54, 56 is formed by a reverse bend portion of the contact 36 so that one side of the contact 36 is on the outside of one nose and on the inside of the other nose and the other side of the strip is on the outside of the other nose and on the inside of the first nose. The outer or convex surface 61 of the bowed flexing portion 62 is a continuation of the outer surface of nose 56 which extends to the inner surface of nose 54. The contact is flared outwardly to either side of the nose 56 to form seating shoulders 64 as shown in FIG. 2. The strip extends from cam follower portion 60 to form a bar follower portion 66 which ends in an upwardly bent tab 68.

Each contact 36 is confined in a cavity 32 in one of the side members 24. A retaining bar 70, formed of insulating material, extends along the length of each side member 24 in a channel 72 defined by recesses 74 formed in the tops of partitions 34 and extending into the corners 30 of the frame at 76. The bars are locked in the channels by detents 78 in the recesses 74.

With the bars 70 removed from the side members, the contacts 36 are placed into the individual cavities 32 from the tops of the side members so that the noses 56 project from lower openings 50, the noses 54 extend outwardly of the cavities and into an L-shaped recesses 80 located at the top of the side members adjacent inner side walls 26, and the bent up tabs 68 and the outer ends of portions 66 are in approximate alignment with the channels 72. The retaining bars 70 are then snapped into the channels to bend down the upper ends of the contacts 36 and seat the contacts in the side members as shown in FIGS. 2 and 3. In this position, as shown in FIG. 2, a nose 54 projects into recess 80, the cam follower portion 60 and bar follower portion 66 are compressed between cam surface 82 of the side member and bar 70, the flexing portion 62 is lightly stressed and the nose 56 projects outwardly of opening 50 a distance slightly below the lower surface 40 of corner pads 44. The shoulders 64 engage the sides of the opening 50.

The frame 14 with loaded terminals in the cavities 32 may then be mounted on circuit board 12 by means of bolts 18 and nuts 20. When secured in this position, the alignment collars 42 extend into holes 48 and the corner pads 44 are drawn down flush upon the surface of the board so that the contact noses 56 projecting below the corner pads are brought into light engagement with their respective printed circuit pads 52 on the board. Subsequently, a leadless package 90 shaped to fit within the recesses 80 extending along side members 24 and having a conductive contact pad 92 located above each contact nose 54 extending into the recesses 80 is positioned to rest on the noses 54 with the edges of the package partially in the recesses 80. Hold-down plate 16 is then placed on top of the frame 14 and is moved down over the ends of the bolts 18 so that the corner holes 92' formed therein surround the nuts 20. Plate hold down nuts 22 are then secured to the bolts thus lowering the cover plate until it rests flush upon the top surface 94 of the frame. As the hold down plate 16 is lowered, it engages the upper surface of the package 90 and moves the package 90 down into the recesses 80 deforming the contact 36 in a manner to be described so that a reliable wiped electrical connection is formed between the contact pads on both the circuit board and package and the respective noses of the contacts.

As the package 90 is lowered into recess 80, each contact pad 92 pushes its respective nose 54 down so that the portion 60 of the contact is moved downwardly along the angled cam surface 82 forcing the nose 54 toward the inner wall 26 of its respective side member and wiping the nose along its pad 92. The stressed reverse bend at nose 54 holds the bar follower portion against the retaining bar 70. The nose 54 is rotated in a counter clock-wise direction as viewed in FIGS. 3 and 4 and the contact point on the outer surface of the nose engaging the contact pad 92 moves along the crest of the nose toward the portion 66. Thus, the initial point of contact between the nose 54 and pad 92 wipes along both the surfaces of the nose and contact during lowering of the package 90 to assure the reliability of the electrical connection therebetween.

Lowering of package 90 reduces the spacing between the noses. Such reduction of spacing bends the flexing portion 62 of the contact as shown in FIG. 4 to increase the contact pressure at each nose. This contact pressure is increased because portion 62 is bowed along its length. When it is shortened as a result of lowering of the package, the portion is relatively uniformly stressed along its length thus providing high contact pressure at both of the noses. Bowing of the flexing portion 62 rotates the nose 56 in opening 50 so that its surface is wiped against the surface of contact pad 52 on circuit board 12, thus assuring the break up of any impurities at the interface. FIG. 4 illustrates the position of the contact 36 with the package fully inserted into the cavity formed by the recesses 80 and with the mounting holddown plate 16 flush on the top of the frame. Plate 16 may be formed of metal to conduct heat away from the package.

Contact alignment projections 94 may be provided to either side of the contacts in recesses 32 in order to locate the contacts equidistant from the partitions 34 and reduce electrical interaction between adjacent contacts.

Figures 6, 7:
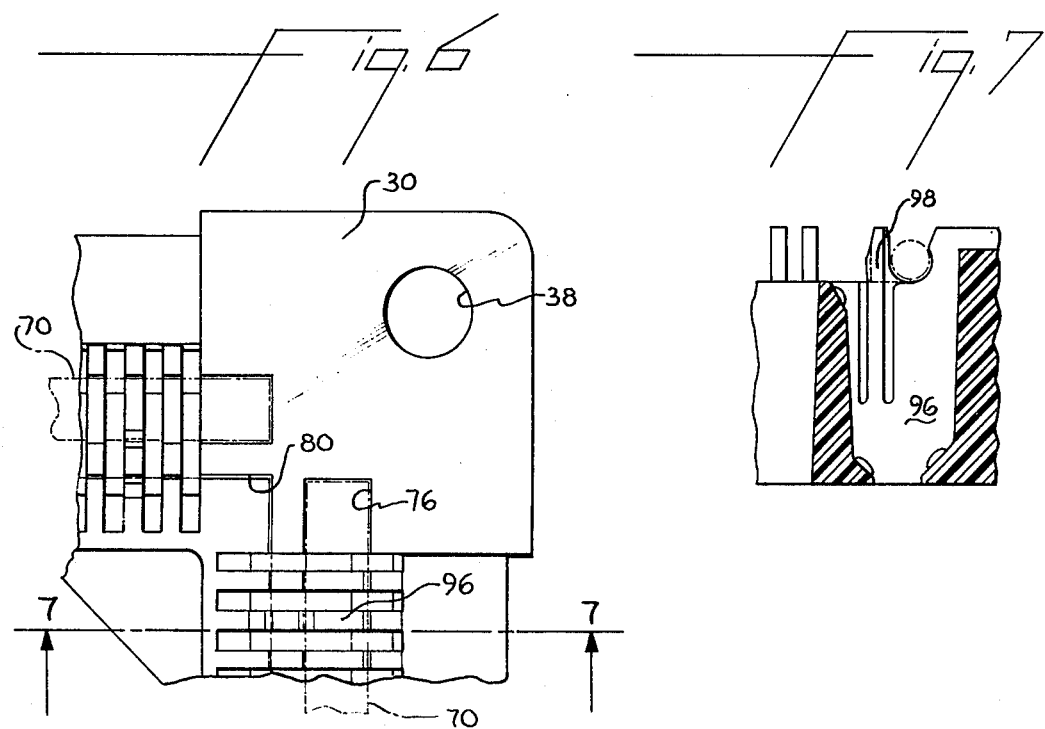
FIG. 6 is a top view of one corner of the frame.
FIG. 7 is a sectional view taken along line 7—7 of FIG. 6.

The frame includes means for centering the package 90 within the recesses 80. As shown in FIG. 7, specialized partitions 96 are provided in the side members adjacent the ends 30 thereof. These partitions each include a resilient locating finger 98 which projects into the recesses 80. As the package is lowered into the frame, its edges engage the fingers 98 and stress the same so that the fingers center the package within the recesses 80.

FIGS. 8 and 9 illustrate the use of an alternate form of contact in a frame identical to that previously described. Contact 100 is like contact 36 with the exception that the flexing portion 102 thereof includes a relatively sharp bend 104 located midway along its length. When the package is lowered into the frame and the flexing portion 102 is bent, as shown in FIG. 9, most of the stress occurs at the bend 104 with the resulting contact pressure at the two noses being somewhat reduced over that obtained upon stressing of contact 36. Both contacts 36 and 100 provide wiping at both of the noses.

While the invention has been described in connection with a frame for forming electrical interconnections between contact pads on an I.C. package and contact pads on a circuit board, it is obvious that the invention could be used to form interconnections between other elements having contact pads where the frame, or a side member, is positioned between elements having contact pads or surfaces and the electrical connections between the pads or surfaces are formed by stressing the contacts as the elements are moved together.

While we have illustrated and described preferred embodiments of our invention, it is understood that these are capable of modification, and we therefore do not wish to be limited to the precise details set forth, but desire to avail ourselves of such changes and alterations as fall within the purview of the following claims.

What we claim for our invention is:

1. A leadless package assembly comprising a rectangular retaining frame having four side members formed of dielectric material and including a plurality of contact cavities, each cavity having an opening adjacent the top of the frame and an opening adjacent the bottom of the frame and a cam surface adjacent the top frame opening; a resilient conductive contact in each cavity, each contact including a first nose exposed through said top frame opening and a second nose exposed through said bottom frame opening, an interconnecting portion joining said noses, such portion including a cam follower segment adjacent said first nose engagable with said cam surface and a bowed spring member extending from said cam follower segment to said second nose; said rectangular frame including mounting means for use in securing the rectangular frame on a circuit board or like member having contact pads adjacent said lower frame openings for forming electrical connections with said second noses; whereby positioning of a leadless package on the top of the frame with contacts on the package in alignment with the top frame openings for forming electrical connections with said first noses and movement of said package toward said openings engages the contact pads on the package with the first noses, and forces such noses into their respective cavities and moves said cam follower segments along the cam surfaces to wipe such noses along the package pads, stress said bowed portions, wipe said second noses along the pads on the circuit board and force the first and second noses against their respective pads.

2. A leadless package assembly as in claim 1 wherein the rectangular frame includes a recess for receiving a leadless package, said top frame openings extending into said recess at the sides thereof; and means for holding a leadless package in said recess.

3. A leadless package assembly as in claim 2 wherein said cavities communicate with the top of the frame, channels extend along the top of the frame across such openings and retaining bars are confined in said channels to confine the contacts in their respective cavities.

4. A leadless package assembly as in claim 1 wherein said contacts are formed of strips of resilient metal, each nose comprising a reverse bend portion of a strip adjacent an end thereof.

5. A leadless package assembly as in claim 4 wherein one side of each strip forms the outside surface of one nose and the inside surface of the other nose.

6. A leadless package assembly as in claim 5 wherein each bowed spring member includes a relatively sharp bend midway along the length thereof.

7. A leadless package assembly as in claim 5 wherein the said bowed spring member is bent along its length.

8. A retaining member comprising an elongate body formed of di-electric material and including a plurality of contact cavities, each cavity having an opening adjacent the top of the body and an opening adjacent the bottom of the body and a cam surface adjacent the top body opening; a resilient conductive contact in each cavity, each contact including a first nose exposed through said top body opening and a second nose exposed through said bottom body opening, and an interconnecting portion joining said noses, such portion including a cam follower segment adjacent said first nose engagable with said cam surface and a bowed spring member extending from said cam follower segment to said second nose; said body including mounting means for use in securing the body on a circuit board or the like having contact pads adjacent said lower member openings for forming electrical connections with said second noses; whereby positioning of a support on the top of the body with contacts on the support in alignment with the top member openings for forming electrical connections with said first noses and movement of said support toward said openings engages the contact pads on the support with the first noses, and forces such noses into their respective cavities and moves said cam follower segments along the cam surfaces to wipe such noses along the support contacts, stress said bowed portions, wipe said second noses along the pads on the circuit board and force the first and second noses against their respective pads.

9. A leadless package assembly as in claim 1 wherein in each contact the bowed spring member joins said second nose at one side thereof adjacent a side of the bottom opening so that stressing of said bowed spring members rotates said second noses and wipes the outer surfaces thereof against the pads on the circuit board.

10. A retaining member as in claim 8 wherein in each contact the bowed spring member joins said second nose at one side thereof adjacent a side of the bottom opening so that stressing of said bowed spring members rotates said second noses and wipes the outer surfaces thereof against the pads on the circuit board.

11. An interconnect unit for forming an electrical connection between two surfaces, the unit including an insulating housing having a cavity presenting an opening and a conductive resilient contact within the cavity, said contact comprising a contact member exposed for engagement with a surface, a nose fitted within the opening having sides adjacent opposed walls of the opening, a curved portion extending outwardly of the opening between said sides with a convex contact surface running a distance along the curved portion of the nose, and a bowed spring member extending from the contact member across the cavity to the nose and joining the nose at one side of the opening whereby movement of a surface against the exposed contact member forces it into the cavity, bows the spring member, biases the nose against a fixed surface adjacent the opening and rotates the nose in the opening so that the contact surface on the nose is wiped against the fixed surface.

* * * * *